US009601687B2

United States Patent
Park et al.

(10) Patent No.: US 9,601,687 B2
(45) Date of Patent: Mar. 21, 2017

(54) DUAL INTERFACE FREE LAYER WITH AMORPHOUS CAP LAYER FOR PERPENDICULAR MAGNETIC TUNNEL JUNCTION

(71) Applicant: QUALCOMM Incorporated, San Diego, CA (US)

(72) Inventors: Chando Park, San Diego, CA (US); Kangho Lee, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 3 days.

(21) Appl. No.: 14/179,502

(22) Filed: Feb. 12, 2014

(65) Prior Publication Data

US 2015/0228891 A1    Aug. 13, 2015

(51) Int. Cl.
| H01L 43/00 | (2006.01) |
| H01L 43/10 | (2006.01) |
| H01L 43/12 | (2006.01) |
| H01L 43/08 | (2006.01) |
| G11C 11/16 | (2006.01) |
| H01L 43/02 | (2006.01) |

(52) U.S. Cl.
CPC ............ *H01L 43/10* (2013.01); *G11C 11/161* (2013.01); *H01L 43/08* (2013.01); *H01L 43/12* (2013.01); *H01L 43/02* (2013.01)

(58) Field of Classification Search
CPC ......... H01L 43/10; H01L 43/12; H01L 43/08; H01L 43/02
See application file for complete search history.

(56) References Cited

U.S. PATENT DOCUMENTS

| 7,948,044 B2 | 5/2011 | Horng et al. |
| 8,492,169 B2 | 7/2013 | Cao et al. |
| 8,514,527 B2 | 8/2013 | Komagaki et al. |
| 2008/0191295 A1 | 8/2008 | Ranjan et al. |
| 2008/0293165 A1* | 11/2008 | Ranjan ................ B82Y 10/00 438/3 |
| 2011/0134563 A1* | 6/2011 | Komagaki ............ B82Y 10/00 360/75 |
| 2012/0181537 A1 | 7/2012 | Cao et al. |
| 2013/0071954 A1 | 3/2013 | Zhou et al. |
| 2013/0075839 A1 | 3/2013 | Chen et al. |
| 2013/0078482 A1 | 3/2013 | Shukh |

(Continued)

OTHER PUBLICATIONS

Park J-H., et al., "Interfacial Oxidation Enhanced Perpendicular Magnetic Anisotropy in Low Resistance Magnetic Tunnel Junctions Composed of Co/Pt Multilayer Electrodes," IEEE Transactions on Magnetics, Nov. 2008, vol. 44, No. 11, pp. 2577-2580.

(Continued)

*Primary Examiner* — Kimberly Rizkallah
*Assistant Examiner* — Alexander Belousov
(74) *Attorney, Agent, or Firm* — Seyfarth Shaw LLP

(57) ABSTRACT

A magnetic tunnel junction (MTJ) and methods for fabricating a MTJ are described. An MTJ includes a fixed layer and a barrier layer on the fixed layer. Such an MTJ also includes a free layer interfacing with the barrier layer. The free layer has a crystal structure in accordance with the barrier layer. The MTJ further includes an amorphous capping layer interfacing with the free layer.

9 Claims, 6 Drawing Sheets

(56) References Cited

U.S. PATENT DOCUMENTS

2014/0027869 A1    1/2014  Lee et al.

OTHER PUBLICATIONS

Sato H., et al., "Perpendicular-anisotropy CoFeB—MgO magnetic tunnel junctions with a MgO/CoFeB/Ta/CoFeB/MgO recording structure," Applied Physics Letters, 2012, vol. 101 (2), pp. 022414-022414-4.
International Search Report and Written Opinion—PCT/US2014/071258—ISA/EPO—Mar. 26, 2015.

* cited by examiner

DUAL INTERFACE FREE LAYER WITH AMORPHOUS CAP LAYER FOR PERPENDICULAR MAGNETIC TUNNEL JUNCTION

BACKGROUND

Field

Aspects of the present disclosure relate to semiconductor devices, and more particularly to a dual interface free layer with an amorphous cap layer used in perpendicular magnetic tunnel junction (pMTJ) devices.

Background

Unlike conventional random access memory (RAM) chip technologies, in magnetic RAM (MRAM) data is stored by magnetic polarization of storage elements. The storage elements are formed from two ferromagnetic layers separated by a tunneling layer. One of the two ferromagnetic layers, which is referred to as the fixed (e.g., pinned) layer, has a magnetization that is fixed in a particular direction. The other ferromagnetic magnetic layer, which is referred to as the free layer, has a magnetization direction that can be altered to two different states. One such device having a fixed layer, a tunneling layer, and a free layer is a magnetic tunnel junction (MTJ).

In an MTJ, the different states of the free layer may be used to represent either a logic "1" or a logic "0". In particular, the electrical resistance of an MTJ depends on whether the free layer magnetization and fixed layer magnetization are parallel or anti-parallel with each other. For example, a logic "1" state is represented when the free layer magnetization is anti-parallel to the fixed layer magnetization. A logic "0" state is represented when the free layer magnetization is parallel to the fixed layer magnetization. A memory device such as MRAM is built from an array of individually addressable MTJs.

To write data in a conventional MRAM, a write current exceeding a critical switching current is applied through an MTJ. The write current should exceed the switching current by a sufficient amount to change the magnetization direction of the free layer. When the write current flows in a first direction, the MTJ is placed into or remains in a first state. In the first state, a free layer magnetization direction and a fixed layer magnetization direction of the MTJ are aligned in a parallel orientation. When the write current flows in a second direction, opposite to the first direction, the MTJ is placed into or remains in a second state. In the second state, the free layer magnetization and fixed layer magnetization of the MTJ are in an anti-parallel orientation.

SUMMARY

In an aspect of the disclosure, a magnetic tunnel junction (MTJ) includes a fixed layer and a barrier layer on the fixed layer. Such an MTJ also includes a free layer interfacing with the barrier layer. The free layer has a crystal structure in accordance with the barrier layer. The MTJ further includes an amorphous capping layer interfacing with the free layer.

In another aspect of the disclosure, a method of fabricating a magnetic tunnel junction (MTJ) device includes depositing a fixed layer. The method also includes depositing a barrier layer on the fixed layer. The barrier layer has a crystalline structure. The method further includes depositing an amorphous free layer on the barrier layer. The method also includes depositing an amorphous capping layer on the free layer. The method further includes annealing the MTJ device so that the amorphous free layer adopts the crystalline structure of the barrier layer.

A magnetic tunnel junction (MTJ) in accordance with another aspect of the present disclosure includes a fixed layer and a barrier layer on the fixed layer. The MTJ also includes means for interfacing with the barrier layer. The means for interfacing has a crystal structure in accordance with the barrier layer. The MTJ further includes an amorphous capping layer interfacing with the free layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
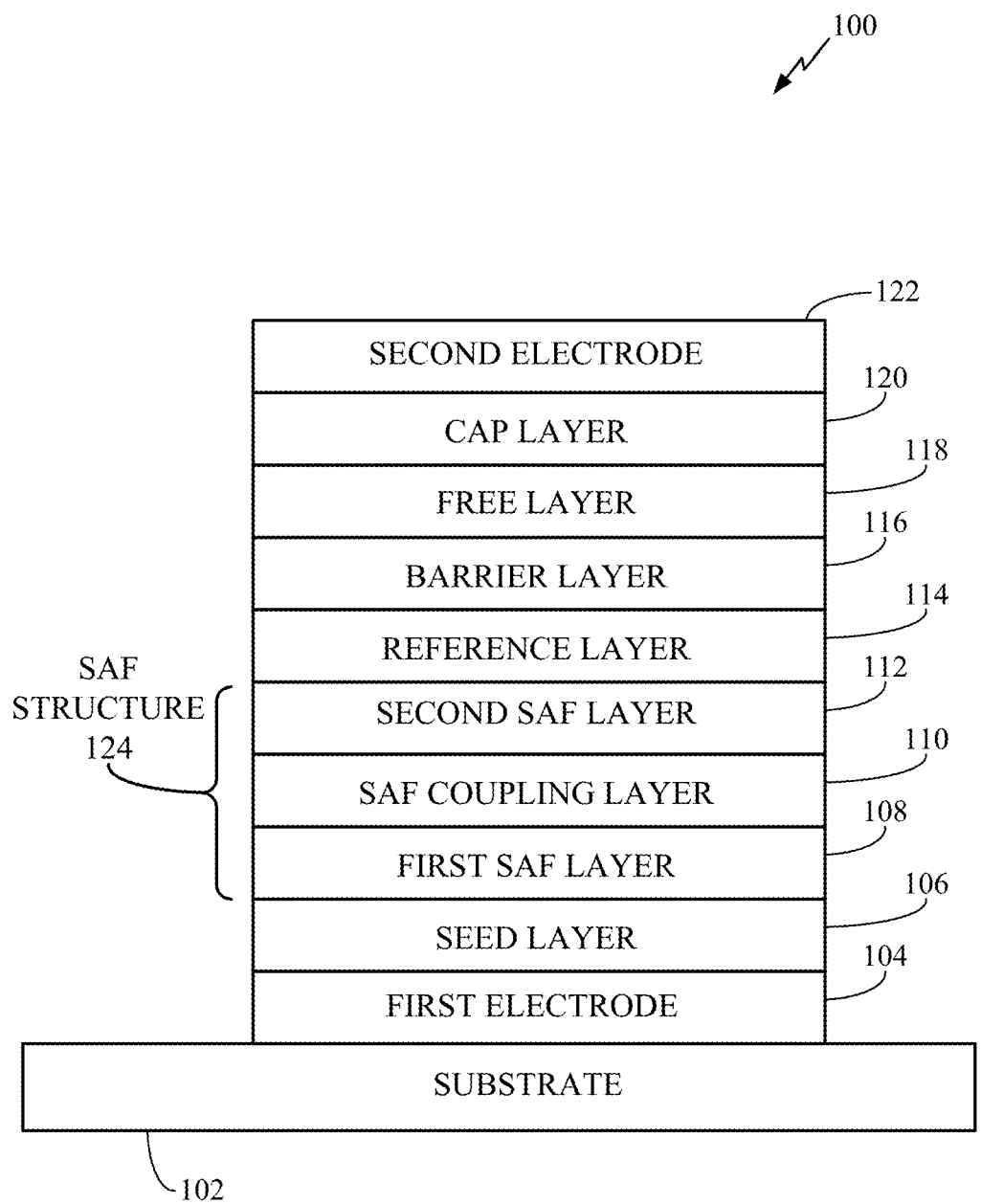
FIG. 1 illustrates a cross-sectional view of a perpendicular magnetic tunnel junction (pMTJ) in accordance with one or more aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR."

Materials used to form a magnetic tunnel junction (MTJ) of a magnetic random access memory (MRAM) generally exhibit high tunneling magneto resistance (TMR), high perpendicular magnetic anisotropy (PMA) and good data retention. MTJ structures may be made in a perpendicular orientation, referred to as perpendicular, magnetic tunnel junction (pMTJ) devices. A stack of materials (e.g., cobalt-iron-boron (CoFeB) materials) with a dielectric barrier layer (e.g., magnesium oxide (MgO)) may be used in a pMTJ structure. A pMTJ structure including a stack of materials (e.g., CoFeB/MgO/CoFeB) has been considered for use in MRAM structures.

This stack of materials (e.g., CoFeB/MgO/CoFeB) within the pMTJ structure may provide a specified perpendicular magnetic anisotropy (PMA). For example, the overall PMA for pMTJ including the material stack of CoFeB/MgO/CoFeB is determined by the interface between the MgO layer and CoFeB layer. Many times, a thinner CoFeB layer is favorable to increase the PMA. A thinner CoFeB layer within the pMTJ, however, reduces the TMR and the data retention of the pMTJ structure.

The data retention capability of the pMTJ structure is provided by the free layer. A dual interface (e.g., barrier MgO/CoFeB/MgO cap) in the storage layer (e.g., free layer) may improve the TMR and data retention, but still exhibit an insufficient amount of TMR. The insufficient amount of TMR is the result of the two different MgO/CoFeB interfaces within the free layer. In particular, the two different MgO/CoFeB interfaces may induce crystal orientation mismatches in the thin CoFeB layer during post-annealing.

In an aspect of the present disclosure, a magnetic tunnel junction (MTJ) device includes a free layer, a barrier layer and a fixed layer. In one configuration, the free layer interfacing with the barrier layer. In particular, the free layer has a crystal structure in accordance with the barrier layer. An amorphous capping layer interfaces with the free layer. In this configuration, the amorphous capping layer prevents crystallization at the interface with the free layer. Instead, crystallization occurs at the interface between the free layer and the barrier layer. As a result, the crystal structure of the free layer is determined by the crystal structure of the barrier layer.

FIG. 1 illustrates a cross-sectional view of a perpendicular magnetic tunnel junction (pMTJ) structure in accordance with one aspect of the present disclosure. Representatively, a pMTJ structure 100 is formed on a substrate 102. The pMTJ structure 100 may be formed on a semiconductor substrate, such as silicon substrate, or any other alternative suitable substrate material. The pMTJ structure 100 may include a first electrode 104, a seed layer 106, a first synthetic antiferromagnetic (SAF) layer 108, a SAF coupling layer 110, and a second SAF layer 112. The pMTJ structure 100 also includes a reference layer 114, a barrier layer 116, a free layer 118, a cap layer 120 (also known as a capping layer), and a second electrode 122. The pMTJ structure 100 may be used in various types of devices, such as a semiconductor memory device (e.g., a magnetic random access memory (MRAM)).

In this configuration, the first electrode 104 and the second electrode 122 include conductive materials (e.g., tantalum (Ta)). In other configurations, the first electrode 104 and/or second electrode 122 may include other appropriate materials, including but not limited to platinum (Pt), copper (Cu), gold (Au), aluminum (Al), or other like conductive materials. The first electrode 104 and the second electrode 122 may also use different materials within the pMTJ structure 100.

A seed layer 106 is formed on the first electrode 104. The seed layer 106 may provide a mechanical and crystalline substrate for the first SAF layer 108. The seed layer 106 may be a compound material, including but not limited to, nickel chromium (NiCr), nickel iron (NiFe), NiFeCr, or other suitable materials for the seed layer 106. When the seed layer 106 is grown or otherwise coupled to the first electrode 104, a smooth and dense crystalline structure results in the seed layer 106. In this configuration, the seed layer 106 promotes growth of subsequently formed layers in the pMTJ structure 100 according to a specific crystalline orientation. The crystalline structure of the seed layer 106 may be selected to be any crystal orientation within the Miller index notation system, but is often chosen to be in the (111) crystal orientation.

A first SAF layer 108 is formed on the seed layer 106. The first SAF layer 108 may be a single layer of material, or may be a multi-layer stack of materials, which is formed on the seed layer 106. The multi-layer stack of materials used for the first SAF layer 108 may be a ferromagnetic material or a combinations of materials to create a ferromagnetic moment in the first SAF layer 108. The multi-layer stack of materials used form the first SAF layer 108 includes, but not limited to, cobalt (Co), cobalt in combination with other materials such as nickel (Ni), platinum (Pt), or palladium (Pd), or other like ferromagnetic materials.

An SAF coupling layer 110 is formed on the first SAF layer 108, and promotes magnetic coupling between the first SAF layer 108 and a second SAF layer 112. The SAF coupling layer 110 includes material that aides in this coupling including, but not limited to, ruthenium (Ru), tantalum (Ta), gadolinium (Gd), platinum (Pt), hafnium (Hf), osmium (Os), rhodium (Rh), niobium (Nb). Terbium (Tb), or other like materials. The SAF coupling layer 110 may also include materials to provide mechanical and/or crystalline structural support for the first SAF layer 108 and the second SAF layer 112.

The second SAF layer 112 is formed on the SAF coupling layer 110. The second SAF layer 112 may use similar materials as the first SAF layer 108, but may include other materials. The combination of the first SAF layer 108, the SAF coupling layer 110, and the second SAF layer 112 forms a SAF structure 124, which is often referred to as a "pinned layer" in the pMTJ structure 100. The SAF structure 124 fixes, or pins, the magnetization direction of the SAF structure 124 through anti-ferromagnetic coupling. The SAF structure 124 may include a cobalt-iron-boron (CoFeB) film. The SAF structure 124 may also include other ferromagnetic material layers, such as CoFeTa, NiFe, Co, CoFe, CoPt, CoPd, FePt, or any alloy of Ni, Co and Fe.

A reference layer 114 is formed on the SAF structure 124. The reference layer 114 provides a crystalline orientation for the barrier layer 116. As with the seed layer 106, the material used in the reference layer 114 provides a template for subsequent layers to be grown in a specific crystalline orientation. This orientation may be in any direction within the Miller index system, but is often in the (100) (or (001)) crystal orientation. The reference layer 114 may also be the last layer of the second SAF layer 112, but is shown as a separate layer for ease of explanation.

A barrier layer 116 (also referred to as a tunnel barrier layer) is formed on the reference layer 114. The barrier layer provides a tunnel barrier for electrons travelling between the SAF structure 124 and the free layer 118. The barrier layer 116, which may include magnesium oxide (MgO), is formed on the reference layer 114 and may have a crystalline structure. The crystalline structure of the barrier layer may be in the (100) direction. The barrier layer 116 may include other elements or other materials, such as aluminum oxide (AlO), aluminum nitride (AlN), aluminum oxynitride (AlON), or other non-magnetic or dielectric material. The thickness of the barrier layer 116 is formed such that electrons can tunnel from the SAF structure 124 through the barrier layer 116 to the free layer 118 when a biasing voltage is applied to the pMTJ structure 100.

The free layer 118, which may be cobalt-iron-boron (CoFeB), is formed on the barrier layer 116. The free layer 118, when initially deposited on the barrier layer 116, is an amorphous structure. That is, the free layer 118 does not have a crystalline structure when initially deposited on the barrier layer 116. The free layer 118 is also a ferromagnetic layer or multilayer material, which may be the same ferromagnetic material as the SAF structure 124 or may use different materials.

In this configuration, the free layer 118 includes a ferromagnetic material that is not fixed or pinned in a specific magnetic orientation. The magnetization orientation of the free layer 118 is able to rotate to be in a parallel or an anti-parallel direction to the pinned magnetization of the SAF structure 124. A tunneling current flows perpendicularly through the barrier layer 116 depending upon the relative magnetization directions of the SAF structure 124 and the free layer 118.

A cap layer 120 is formed on the free layer 118. The cap layer 120 may be a dielectric layer, or other insulating layer, to allow containment of the magnetic and electric fields between the free layer 118 and the SAF structure 124. The cap layer 120 helps reduce the switching current density used to switch the pMTJ structure 100 from one orientation (e.g., parallel) to the other (e.g., anti-parallel). The cap layer 120, which may also be referred to as a capping layer, may be an oxide, such as, for example, amorphous aluminum oxide (AlOx) or amorphous hafnium oxide (HfOx). The cap layer 120 may also be other materials, such as magnesium oxide (MgO) or other dielectric materials without departing from the scope of the present disclosure.

In this configuration, the cap layer 120 is amorphous when initially deposited on the free layer 118. That is, the cap layer 120 is amorphous and, therefore, does not have an overall crystalline structure when initially deposited. Although portions of the cap layer 120 may be crystalline, the overall structure of the cap layer 120 does not provide a template or other growth pattern that can be transferred to the free layer 118 during subsequent processing (e.g., annealing).

The second electrode 122 is formed on the cap layer 120. In one configuration, the second electrode 122 includes tantalum. Alternatively, the second electrode 122 includes any other suitable conductive material for electrical connection of the pMTJ structure 100 to other devices or portions of a circuit. Formation of the second electrode 122 on the cap layer 120 completes the pMTJ structure 100.

Figure 2:
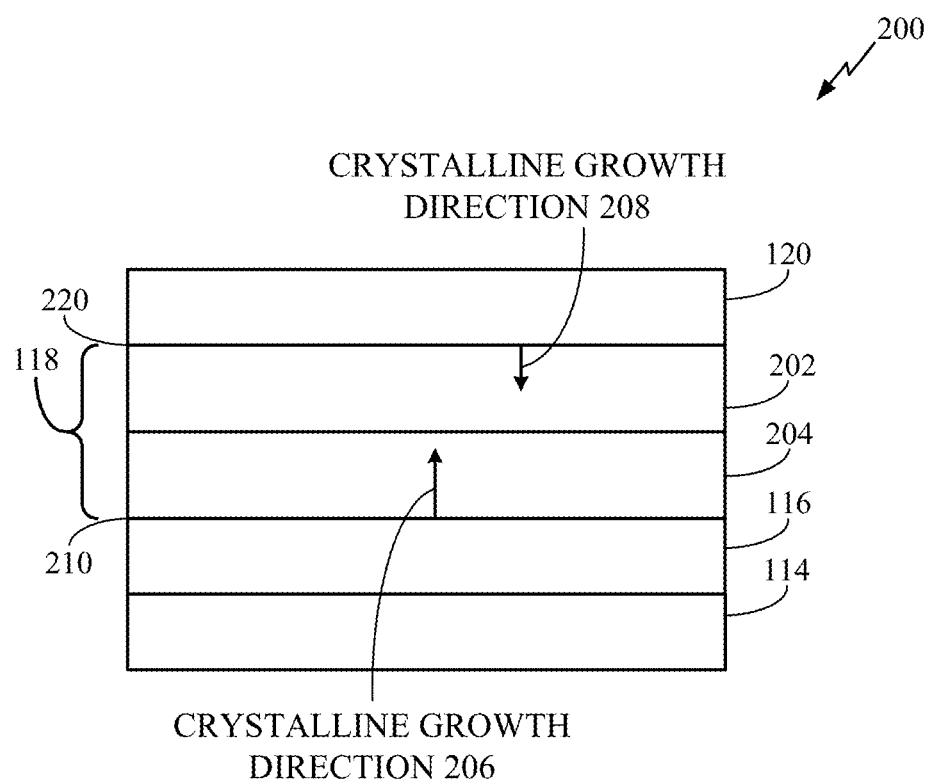
FIG. 2 illustrates a free layer of a perpendicular magnetic tunnel junction (pMTJ) in accordance with one or more embodiments of the present disclosure.

FIG. 2 illustrates a storage layer (e.g., free layer) of a pMTJ structure in accordance with one aspect of the present disclosure. A portion 200 of the pMTJ structure 100 of FIG. 1, including the reference layer 114, the barrier layer 116, the free layer 118 and the cap layer 120, is further illustrated in FIG. 2. The free layer 118 includes a first layer 202 and a second layer 204. The first layer 202 may be an iron-rich layer within the free layer 118. The second layer 204 may be a cobalt-rich layer within the free layer 118. The crystallization of the free layer 118, in this configuration, begins at an interface 210 between the free layer 118 and the barrier layer 116, along a crystalline growth direction 206.

As discussed in FIG. 1, the barrier layer 116 has a crystalline orientation. The barrier layer 116 initially has an amorphous structure. The crystalline orientation of the barrier layer 116 may be acquired from the reference layer 114. The crystalline orientation of the barrier layer 116, however, may also be acquired through the properties and/or deposition technique used to form the barrier layer 116 on the reference layer 114. The crystalline orientation of the barrier layer 116, in this configuration, is transferred to the free layer 118 in the crystalline growth direction 206. As shown in FIG. 2, the crystalline orientation of the barrier layer 116 is transferred to the second layer 204.

Because the second layer 204 (e.g., a CoFeB layer) is amorphous when deposited on the barrier layer 116, subsequent processing steps transfer the crystalline structure of the barrier layer 116 to the second layer 204. These subsequent processing steps may be annealing steps, or other process steps, for controlling the transfer of the crystalline orientation from the barrier layer 116 to the second layer 204. These subsequent processing steps also control the crystalline growth direction 206. In particular, the crystalline growth continues in the crystalline growth direction 206 through the second layer 204.

Because the cap layer 120 and the first layer 202 are amorphous, there is a reduced crystalline orientation transfer from the cap layer 120 to the first layer 202 along a crystalline growth direction 208. As such, the crystalline orientation of the portion 200 of the pMTJ structure 100 is derived from the crystalline structure of the barrier layer 116, and crystallization proceeds from the interface 210 in the crystalline growth direction 206. Because there is reduced or no growth in the crystalline growth direction 208, there are fewer competing crystalline orientations or lattice mismatches within the free layer 118 (e.g., within the second layer 204 and/or the first layer 202). This control of the crystalline growth through the free layer 118, along the crystalline growth direction 206, allows for increased tunneling magneto resistance (TMR). In this configuration, the TMR of the pMTJ structure 100 is increased because the cap layer 120 reduces the propagation of an offsetting crystalline orientation template from the cap layer 120 into the free layer 118.

In a configuration in which the second layer 204 is part of a CoFeB layer, the second layer 204 is composed of sixty percent iron, twenty percent cobalt, and twenty percent boron. The second layer 204 promotes perpendicular magnetic anisotropy (PMA) in the interface 210 between the barrier layer 116 and the second layer 204. Promoting the PMA in the interface 210 between the barrier layer 116 and the second layer 204 improves the performance of the pMTJ structure 100. Other compositions of CoFeB, or other alloys and compositions of materials, are envisioned as within the scope of the present disclosure.

The second layer 204 also assists in the maintenance of the crystalline orientation of the barrier layer 116 as the free layer 118 becomes a crystalline structure during annealing or other subsequent processing steps. The second layer 204, when it comprises CoFeB, produces a higher PMA due to the iron-oxygen interface. The iron-oxygen orbital hybridization is the origin of the strong PMA for the CoFeB/MgO interface. Maintaining the orientation of the barrier layer 116 increases TMR of the pMTJ structure 100 in this aspect of the disclosure. The crystalline orientation of the barrier layer 116 may be transferred to the entire portion of the free layer 118, including a portion of or all of the first layer 202. Alternatively, the crystalline orientation of the barrier layer 116 is transferred to only a portion of the free layer 118. The amorphous nature of the cap layer 120, when employing a material such as AlOx or HfOx, does not allow the crystalline structure to advance from the cap layer 120 into the free layer 118. As a result, the crystalline structure of the free layer 118 is terminated within the free layer 118. Termination of the crystalline structure with the free layer 118 also increases the PMA at an interface 220 between the free layer 118 and the cap layer 120.

In a configuration in which the first layer 202 is part of a CoFeB layer, the first layer 202 has a sixty percent cobalt, twenty percent iron, and twenty percent boron composition. Other compositions of CoFeB, or other alloys and compositions of materials, are envisioned as within the scope of the present disclosure. In this configuration, the first layer 202 promotes PMA in the interface 220 between the cap layer 120 and the first layer 202. Promoting the PMA in the interface 220 between the cap layer 120 and the first layer 202 improves the performance of the pMTJ structure 100. Further, the first layer 202 has a lower magnetic moment than the second layer 204. The lower magnetic moment of the first layer 202 helps reduce the demagnetization effect on the pMTJ structure 100. This also increases the PMA of the pMTJ structure 100 employing this aspect of the disclosure.

Although shown as distinct layers, the second layer 204 and the first layer 202 may be a graded layer. In this configuration, the percentage content of the iron and cobalt are varied as a function of distance from the interface 210 to the barrier layer 116 and/or as a function of distance to the cap layer 120. Further, other ferromagnetic materials may be used in place of iron in the second layer 204 and the first layer 202 without departing from the scope of the present disclosure. The change from the second layer 204 to the first layer 202 within the free layer 118, in this configuration, does not allow the crystalline structure within the free layer 118 to advance as rapidly during subsequent processing steps. The change in the crystal transfer rate also reduces the opportunities to transfer the crystalline orientation and structure to the cap layer 120. This change in crystallization rate within the free layer 118 allows additional control of the structure of the free layer 118. This additional control of the free layer 118 may also increase the TMR and PMA of the pMTJ structure 100.

The free layer 118 may have a thickness of about 20 to 25 angstroms. The second layer 204 may be about 5 angstroms thick, and the first layer 202 may be about 20 angstroms thick. Other thicknesses are possible while remaining within the scope of the present disclosure. The cap layer 120 may be about 10 angstroms thick. As the cap layer 120 thickness is reduced, the cap layer 120 employing AlOx or other amorphous materials remains amorphous and reduces the crystalline growth into the free layer 118. This increases the PMA at the interface 220 between the free layer 118 and the cap layer 120.

Figure 3:
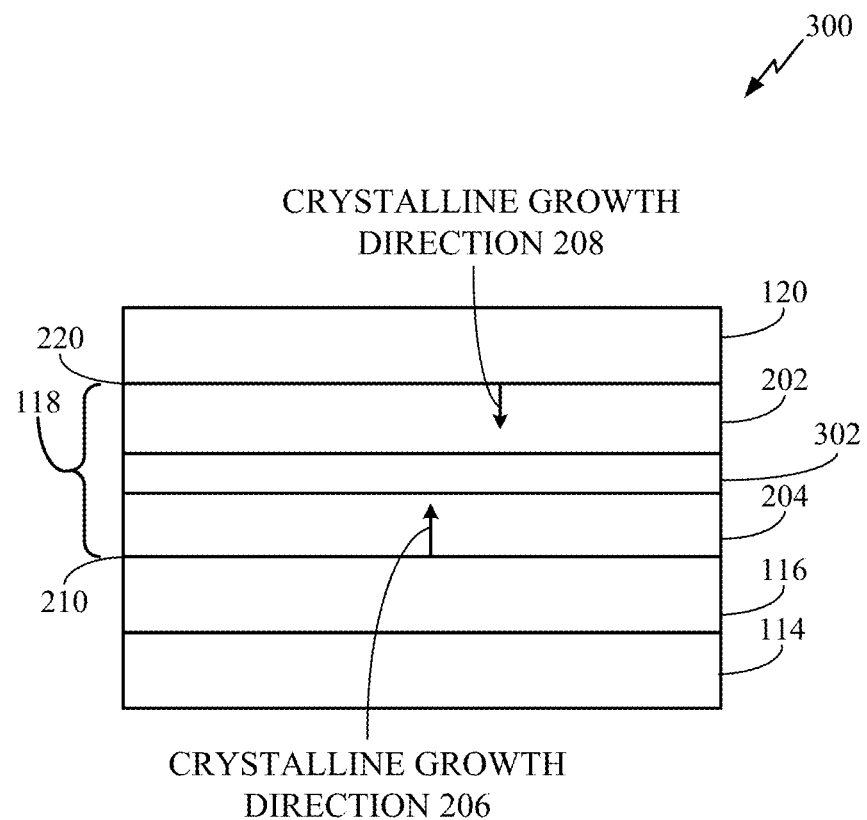
FIG. 3 illustrates an insertion layer in a free layer of a perpendicular magnetic tunnel junction (pMTJ) in accordance with one or more aspects of the present disclosure.

FIG. 3 illustrates an insertion layer 302 in the free layer 118 in accordance with one aspect of the present disclosure. If additional resistance to formation of the crystal orientation in the free layer 118 is specified, the insertion layer 302 shown in FIG. 3 may be included in the free layer 118. A pMTJ structure 100 may include the structure 300 having the insertion layer 302. The insertion layer 302 may be a different material than used in the free layer 118 if desired. Such materials may include tantalum (Ta), ruthenium (Ru), copper (Cu), or other materials.

In this configuration, the insertion layer 302 is included to further slow the advance of any crystal orientation from the cap layer 120 through the free layer 118 in the crystalline growth direction 208. The insertion layer 302 may also or alternatively be included to stop the growth of any crystal orientation from the barrier layer 116 in the crystalline growth direction 206. Further, inclusion of the insertion layer 302 may increase the PMA of the pMTJ structure 100 by maintaining the crystalline orientation at the interface 210 of the barrier layer 116 and the free layer 118. The inclusion of the insertion layer 302 may also prevent the crystal orientation of the barrier layer 116 from advancing to the first layer 202 portion of the free layer 118. The inclusion of the insertion layer 302 may also reduce the total magnetic moment and may reduce the demagnetization effect of the structure 300 within the pMTJ structure 100.

Figure 4:
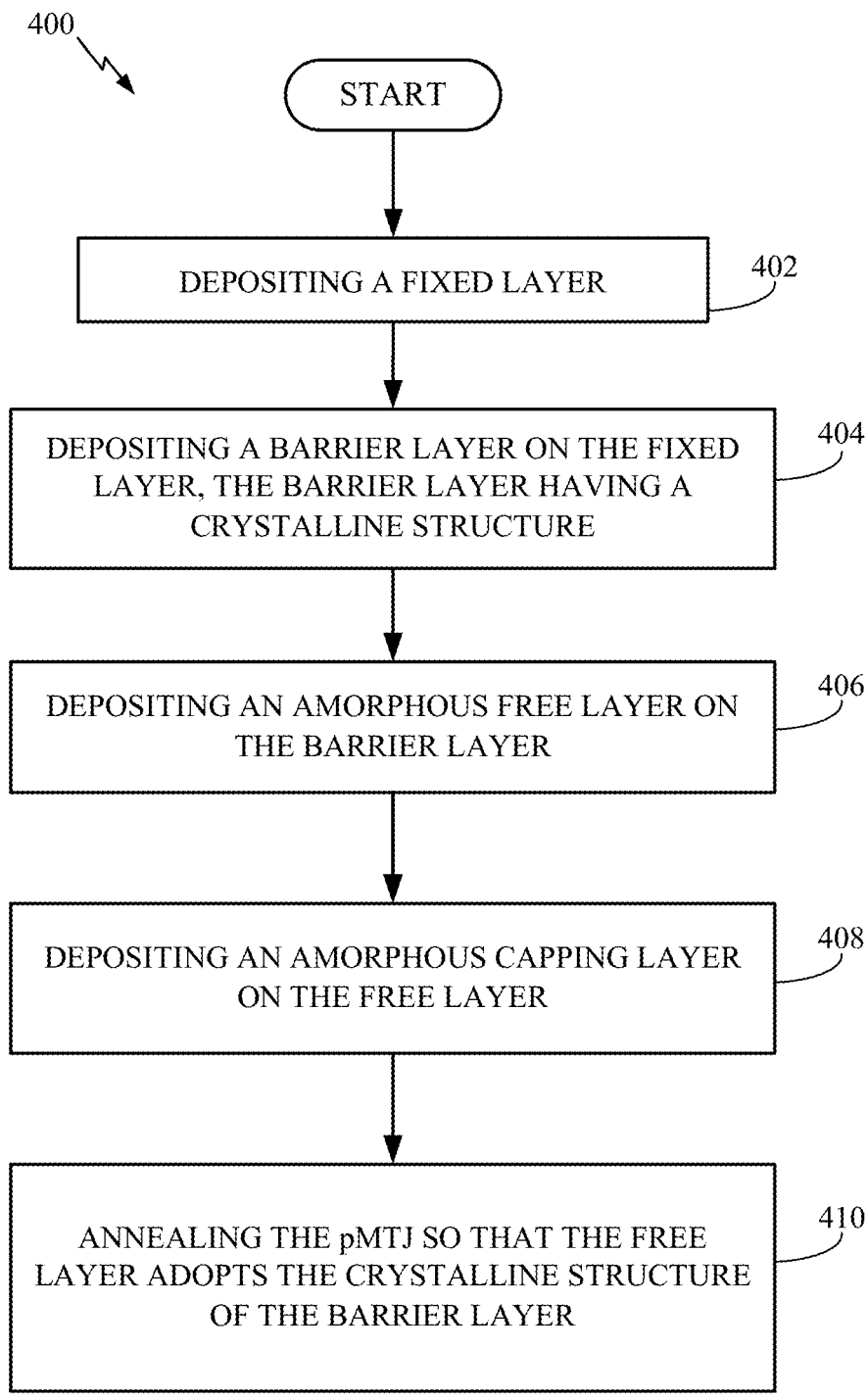
FIG. 4 is a process flow diagram illustrating one or more aspects of the present disclosure.

FIG. 4 is a process flow diagram illustrating a method 400 of forming a dual interface free layer with an amorphous cap layer in pMTJ device of one aspect of the present disclosure. At process block 402 a fixed layer is deposited. At process block 404, a barrier layer is deposited on the fixed layer. The barrier layer has a crystalline structure. For example, as shown in FIG. 2, a barrier layer 116 is deposited on a fixed layer (e.g., reference layer 114. At process block 406, an amorphous free layer is deposited on the barrier layer. At process block 408 an amorphous capping layer is deposited on the free layer. For example, as shown in FIG. 2, a free layer 118 is deposited on the barrier layer 116. In addition, a cap layer 120 is deposited on the free layer 118.

At process block 410, annealing of the pMTJ is performed so that the free layer adopts the crystalline structure of the barrier layer. Referring again to FIG. 2, the cap layer 120 is amorphous, thereby preventing crystallization at the interface 220 with the free layer 118. Instead, crystallization occurs at the interface 210 between the free layer 118 and the barrier layer 116. As a result, the crystal structure of the free layer 118 is determined by the crystal structure of the barrier layer 116 in this aspect of the disclosure.

According to a further aspect of the present disclosure, a magnetic tunnel junction (MTJ) is described. In one configuration, the MTJ includes a fixed layer and a barrier layer on the fixed layer. Such a MTJ also includes means for interfacing with the barrier layer. The means for interfacing has a crystal structure in accordance with the barrier layer. The interfacing means may be the free layer 118 as described with respect to FIG. 1. The MTJ also includes an amorphous capping layer interfacing with the interfacing means. In another aspect, the aforementioned means may be any layer, any interface or structure configured to perform the functions recited by the aforementioned means.

Figure 5:
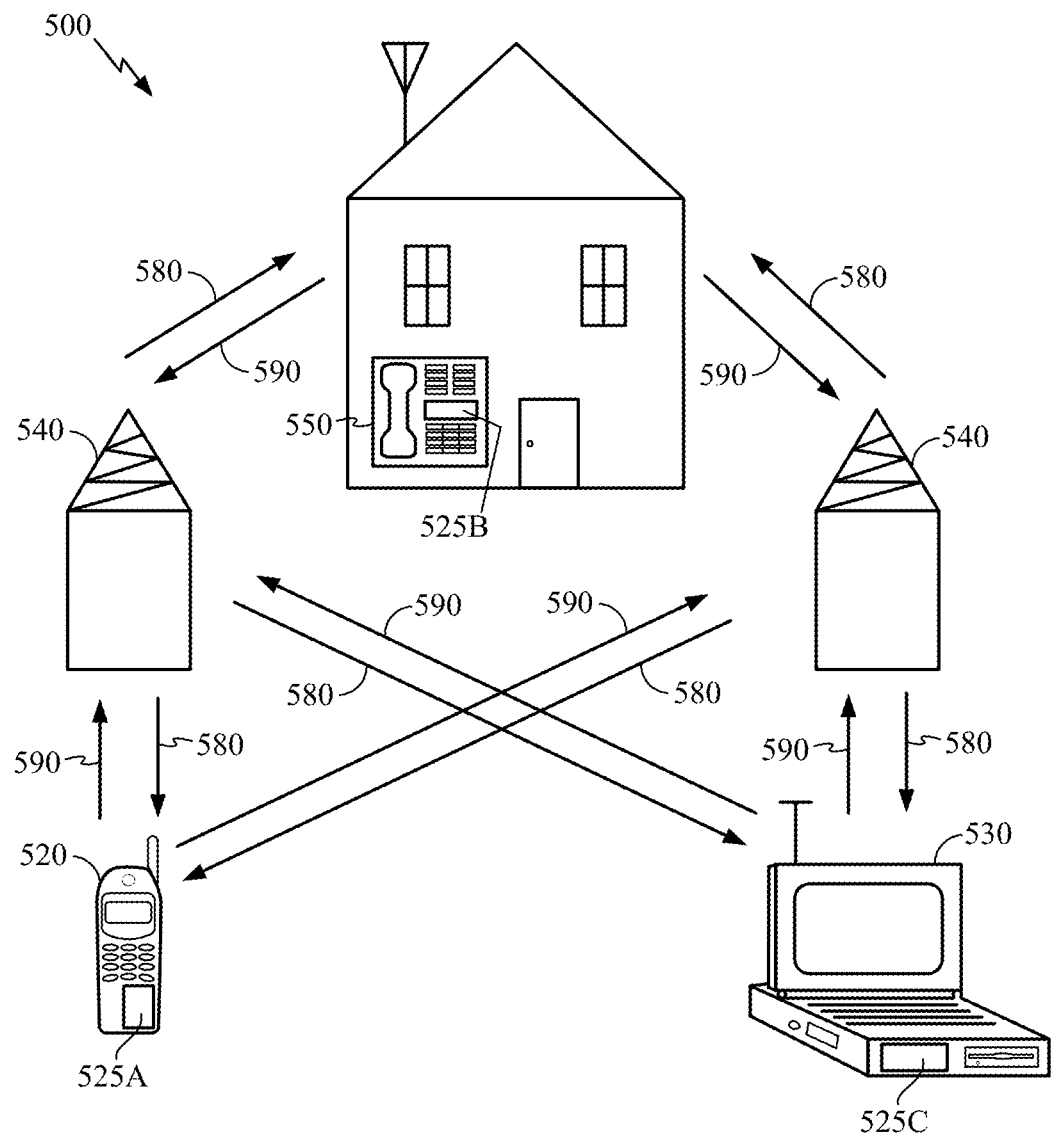
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed pMTJ devices. It will be recognized that other devices may also include the disclosed pMTJ devices, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed pMTJ devices.

Figure 6:
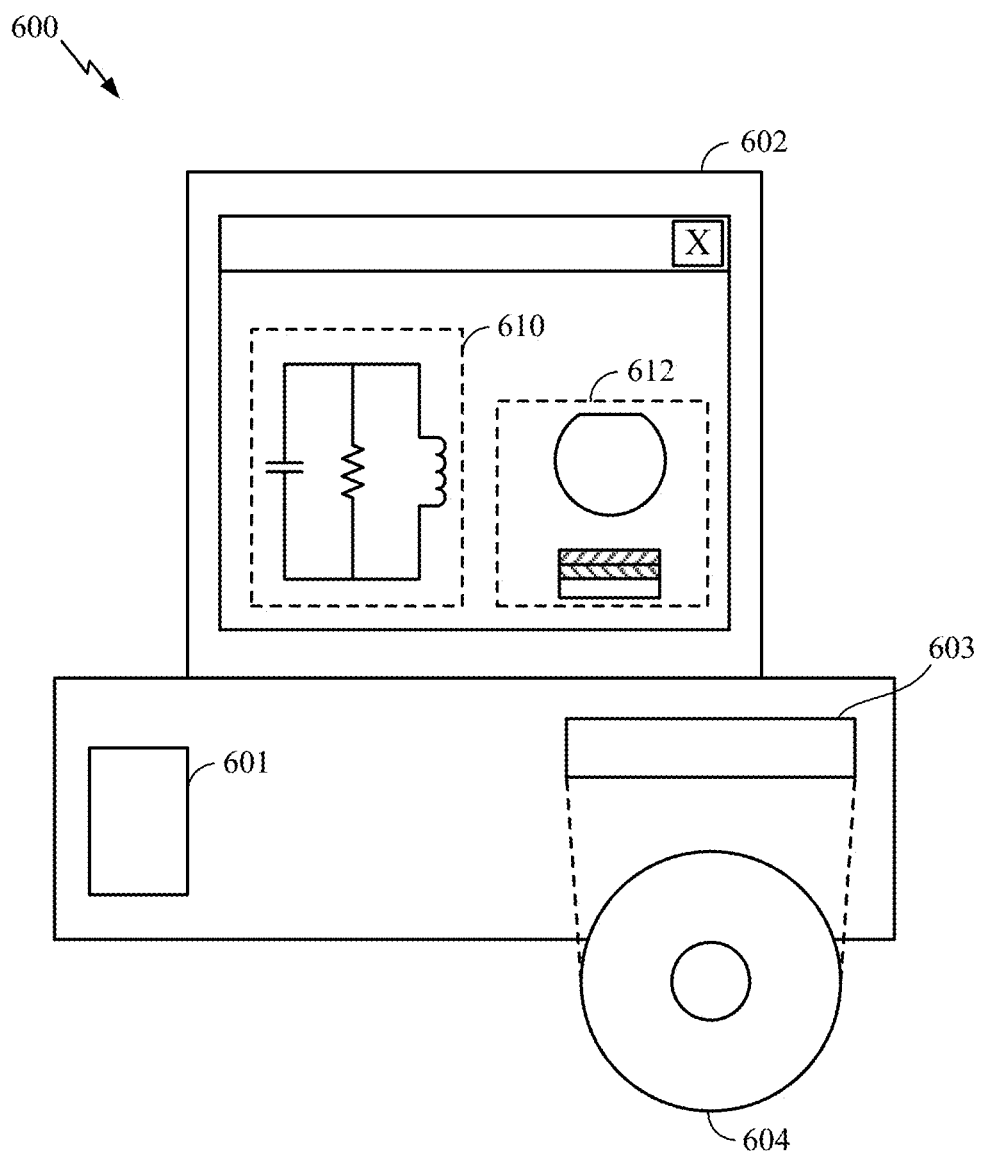
FIG. 6 is a block diagram illustrating a design workstation used for circuit, layout, and logic design of a semiconductor component according to one configuration.

FIG. 6 is a block diagram illustrating a design workstation used for circuit, layout, and logic design of a semiconductor component, such as the pMTJ devices disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as a pMTJ device. A storage medium 604 is provided for tangibly storing the design of the circuit 610 or the semiconductor component 612. The design of the circuit 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the semiconductor component 612 by decreasing the number of processes for designing semiconductor wafers.

Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. A computer-readable medium may include, by way of example, memory such as a magnetic storage device (e.g., hard disk, floppy disk, magnetic strip), an optical disk (e.g., compact disc (CD), digital versatile disc (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, or a removable disk. Although memory is shown separate from the processors in the various aspects presented throughout this disclosure, the memory may be internal to the processors (e.g., cache or register).

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, in which reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A magnetic tunnel junction (MTJ), comprising:
    a fixed layer;
    a barrier layer on the fixed layer;
    a free layer comprising an amorphous first layer and an amorphous second layer, the amorphous second layer interfacing with the barrier layer, in which a portion of the amorphous second layer is crystallized, and a conductive insertion layer is arranged between the amorphous first layer and the amorphous second layer, in which the insertion layer is comprised of a chemical element not present in the amorphous first and second layers; and
    an oxide capping layer interfacing with a surface of the amorphous first layer opposite the barrier layer, in which the amorphous first layer is between the oxide capping layer and the barrier layer, and in which the conductive insertion layer prevents crystallization of portions of the free layer proximate the oxide capping layer, and the conductive insertion layer prevents crystallization of portions of the amorphous first layer.

2. The MTJ of claim 1, in which the barrier layer comprises magnesium oxide (MgO).

3. The MTJ of claim 2, in which the oxide capping layer comprises aluminum oxide (AlOx).

4. The MTJ of claim 2, in which the oxide capping layer comprises hafnium oxide (HfOx).

5. The MTJ of claim 1, in which the amorphous first layer has a lower magnetic moment than the amorphous second layer.

6. The MTJ of claim 5, in which the amorphous first layer and the amorphous second layer comprise cobalt iron boron (CoFeB).

7. The MTJ of claim 1 integrated into a mobile phone, a set top box, a music player, a video player, an entertainment unit, a navigation device, a computer, a hand-held personal communication systems (PCS) unit, a portable data unit, and/or a fixed location data unit.

8. A magnetic tunnel junction (MTJ), comprising:
    a fixed layer;
    a barrier layer on the fixed layer;
    a free layer comprising an amorphous first layer and means for interfacing with the barrier layer, in which a portion of the interfacing means is crystallized, and a conductive insertion layer is arranged between the amorphous first layer and the interfacing means, in which the insertion layer is comprised of a chemical element not present in the amorphous first layer and the interfacing means; and
    an oxide capping layer interfacing with a surface of the amorphous first layer opposite the barrier layer, in which the amorphous first layer is between the oxide capping layer and the barrier layer, and in which the conductive insertion layer prevents crystallization of portions of the free layer proximate the oxide capping layer, and the conductive insertion layer prevents crystallization of portions of the amorphous first layer.

9. The MTJ of claim 8 integrated into a mobile phone, a set top box, a music player, a video player, an entertainment unit, a navigation device, a computer, a hand-held personal communication systems (PCS) unit, a portable data unit, and/or a fixed location data unit.

* * * * *